(12) United States Patent
Lee

(10) Patent No.: US 11,961,854 B2
(45) Date of Patent: Apr. 16, 2024

(54) SEMICONDUCTOR DEVICE

(71) Applicant: Sywe Neng Lee, Taipei (TW)

(72) Inventor: Sywe Neng Lee, Taipei (TW)

(*) Notice: Subject to any disclaimer, the term of this patent is extended or adjusted under 35 U.S.C. 154(b) by 379 days.

(21) Appl. No.: 17/203,759

(22) Filed: Mar. 17, 2021

(65) Prior Publication Data

US 2022/0208813 A1 Jun. 30, 2022

(30) Foreign Application Priority Data

Dec. 29, 2020 (TW) .................... 109146726
Feb. 8, 2021 (CN) ................... 202110180113.4

(51) Int. Cl.
*H01L 27/146* (2006.01)

(52) U.S. Cl.
CPC .. *H01L 27/14607* (2013.01); *H01L 27/14621* (2013.01); *H01L 27/14627* (2013.01); *H01L 27/14629* (2013.01)

(58) Field of Classification Search
CPC ........ H01L 27/14607; H01L 27/14609; H01L 27/14621; H01L 27/14627; H01L 27/14629; H01L 27/14645; H01L 27/1463; H01L 27/14636; H01L 27/14689; H04N 25/75; H04N 25/79; H04N 23/951; H04N 23/45; H04N 23/80; H04N 23/10
USPC ......... 257/59, 233, 292, 432, 440, E27.133, 257/E25.032, E27.138; 348/222.1, 230.1, 348/272, 273, 274, 294, 298, 308, 348/E5.092; 438/29, 69, 181, 459, 510, 438/981, FOR. 171
See application file for complete search history.

(56) References Cited

U.S. PATENT DOCUMENTS

| 5,453,135 A | 9/1995 | Nakagawa et al. |
| 7,615,808 B2 * | 11/2009 | Pain .................. H01L 27/14689 257/292 |
| 7,883,926 B2 * | 2/2011 | Shiau ................ H01L 27/14687 438/459 |

(Continued)

FOREIGN PATENT DOCUMENTS

| CN | 102332457 A | * | 1/2012 | ............. H01L 24/19 |
| CN | 104871527 A | * | 8/2015 | ....... H01L 27/14621 |

(Continued)

OTHER PUBLICATIONS

Office Action of Taiwan Counterpart Application, dated Aug. 5, 2021, pp. 1-6.

(Continued)

*Primary Examiner* — Thao P Le
(74) *Attorney, Agent, or Firm* — JCIPRNET

(57) ABSTRACT

A semiconductor device, including a dielectric layer and a semiconductor substrate, is provided. The dielectric layer has a convexity or a concavity. The semiconductor substrate includes a first type semiconductor layer and a second type semiconductor layer sequentially stacked on the dielectric layer. The first type semiconductor layer is disposed on the convexity or the concavity. A top surface and a bottom surface of the first type semiconductor layer are protruded according to the convexity or recessed according to the concavity. A bottom surface of the second type semiconductor layer is protruded according to the convexity or recessed according to the concavity.

11 Claims, 5 Drawing Sheets

(56) References Cited

U.S. PATENT DOCUMENTS

| | | | |
|---|---|---|---|
| 8,212,297 B1* | 7/2012 | Law | H01L 27/14692 |
| | | | 257/292 |
| 9,209,212 B2 | 12/2015 | Goto | |
| 9,478,575 B2* | 10/2016 | Kato | H01L 27/14625 |
| 9,686,457 B2* | 6/2017 | Madurawe | H01L 27/14629 |
| 9,793,424 B2* | 10/2017 | Cho | G02B 6/4209 |
| 2006/0049439 A1* | 3/2006 | Oh | H01L 27/14685 |
| | | | 257/292 |
| 2009/0160001 A1 | 6/2009 | Kim | |
| 2009/0286346 A1* | 11/2009 | Adkisson | H01L 27/14685 |
| | | | 257/E31.13 |
| 2009/0314340 A1 | 12/2009 | Schindler et al. | |
| 2013/0015326 A1* | 1/2013 | Tamura | H01L 27/14641 |
| | | | 257/290 |
| 2014/0077323 A1* | 3/2014 | Velichko | H01L 27/14629 |
| | | | 257/432 |
| 2014/0111663 A1* | 4/2014 | Soda | H01L 27/14685 |
| | | | 348/222.1 |
| 2015/0155314 A1* | 6/2015 | Takagi | H01L 31/03529 |
| | | | 257/443 |
| 2017/0222071 A1* | 8/2017 | Ji | H01L 31/022433 |
| 2018/0122844 A1 | 5/2018 | Li et al. | |
| 2021/0021773 A1* | 1/2021 | Lee | H04N 25/75 |
| 2021/0043670 A1* | 2/2021 | Jangjian | H01L 27/14621 |
| 2021/0193718 A1* | 6/2021 | Chen | H01L 27/14625 |
| 2022/0208813 A1* | 6/2022 | Lee | H01L 27/14607 |
| 2024/0004257 A1* | 1/2024 | Palanchoke | G02B 5/201 |

FOREIGN PATENT DOCUMENTS

| | | | | |
|---|---|---|---|---|
| CN | 205984987 U | * | 2/2017 | ....... H01L 27/14629 |
| CN | 109906512 A | * | 6/2019 | ............ H01L 27/146 |
| CN | 106409849 B | * | 12/2019 | ......... H01L 25/0655 |
| CN | 114388539 A | * | 4/2022 | ....... H01L 27/14627 |
| JP | H06204527 | | 7/1994 | |
| JP | H08139303 | | 5/1996 | |
| JP | 2012160619 | | 8/2012 | |
| JP | 2013042481 | | 2/2013 | |
| JP | 2014003140 | | 1/2014 | |
| JP | 2016033972 | | 3/2016 | |
| JP | 2017135383 | | 8/2017 | |
| JP | 2020031074 | | 2/2020 | |
| KR | 20090068572 | | 6/2009 | |
| TW | 201010065 | | 3/2010 | |
| TW | 201133802 | | 10/2011 | |
| TW | 201828461 | | 8/2018 | |
| TW | I636561 | | 9/2018 | |

OTHER PUBLICATIONS

Sozo Yokogawa, et al., "IR sensitivity enhancement of CMOS Image Sensor with diffractive light trapping pixels", Scientific Reports, May 10, 2017, pp. 1-9.

"Office Action of Japan Counterpart Application", dated Oct. 10, 2023, p. 1-p. 5.

"Office Action of Japan Counterpart Application", dated Apr. 4, 2023, p. 1-p. 4.

"Office Action of Korea Counterpart Application", with English translation thereof, dated Jun. 5, 2023, p. 1-p. 9.

* cited by examiner

SEMICONDUCTOR DEVICE

CROSS-REFERENCE TO RELEVANT APPLICATION

This application claims the priority benefit of China application serial no. 202110180113.4, filed on Feb. 8, 2021, and Taiwan application serial no. 109146726, filed on Dec. 29, 2020. The entirety of each of the above-mentioned patent applications is hereby incorporated by reference.

BACKGROUND

Technical Field

This disclosure relates to a semiconductor device.

Description of Related Art

A complementary metal-oxide-semiconductor image sensor (CMOS image sensor, CIS) has advantages such as low operating voltage, low power consumption, high operating efficiency, and random access, when compared to a charge coupled device (CCD). At the same time, it also has the advantage of being integrated into conventional semiconductor technology for mass production, and therefore, has a wide range of applications.

A pixel photosensitive element of CIS is mainly composed of P-N diodes, and the intensity of the image signal generated after light exposure is determined by the size of the area of the photosensitive region and the light intensity of the incident ray. In a back-side illuminated (BSI) CIS that is widely used in the market today, its transistor, capacitor and metal circuit layer are all built on a bottom layer of the pixel photosensitive element, therefore the size of the pixel photosensitive region of the BSI-CIS is almost equal to the size of the pixel, enabling the sensitivity of light sensing to be greatly increased.

SUMMARY

This disclosure provides a semiconductor device, which can effectively increase the amount of current generated by the semiconductor device after being irradiated.

According to an embodiment of the disclosure, the semiconductor device includes a dielectric layer and a semiconductor substrate. The dielectric layer has a convexity or a concavity. The semiconductor substrate includes a first type semiconductor layer and a second type semiconductor layer sequentially stacked on the dielectric layer. The first type semiconductor layer is disposed on the convexity or the concavity. A top surface and a bottom surface of the first type semiconductor layer are protruded according to the convexity or recessed according to the concavity. A bottom surface of the second type semiconductor layer is protruded according to the convexity or recessed according to the concavity.

Based on the above, the semiconductor device according to the embodiment of the disclosure can increase the surface area of the junction between multiple semiconductor layers disposed on the convexity or the concavity of the dielectric layer by forming the convexity or the concavity in the dielectric layer, so that the current generated by the irradiation of the photosensitive element or the photoelectric conversion structure in the semiconductor substrate can be increased.

To make the abovementioned more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DESCRIPTION OF THE EMBODIMENTS

Figure 1:
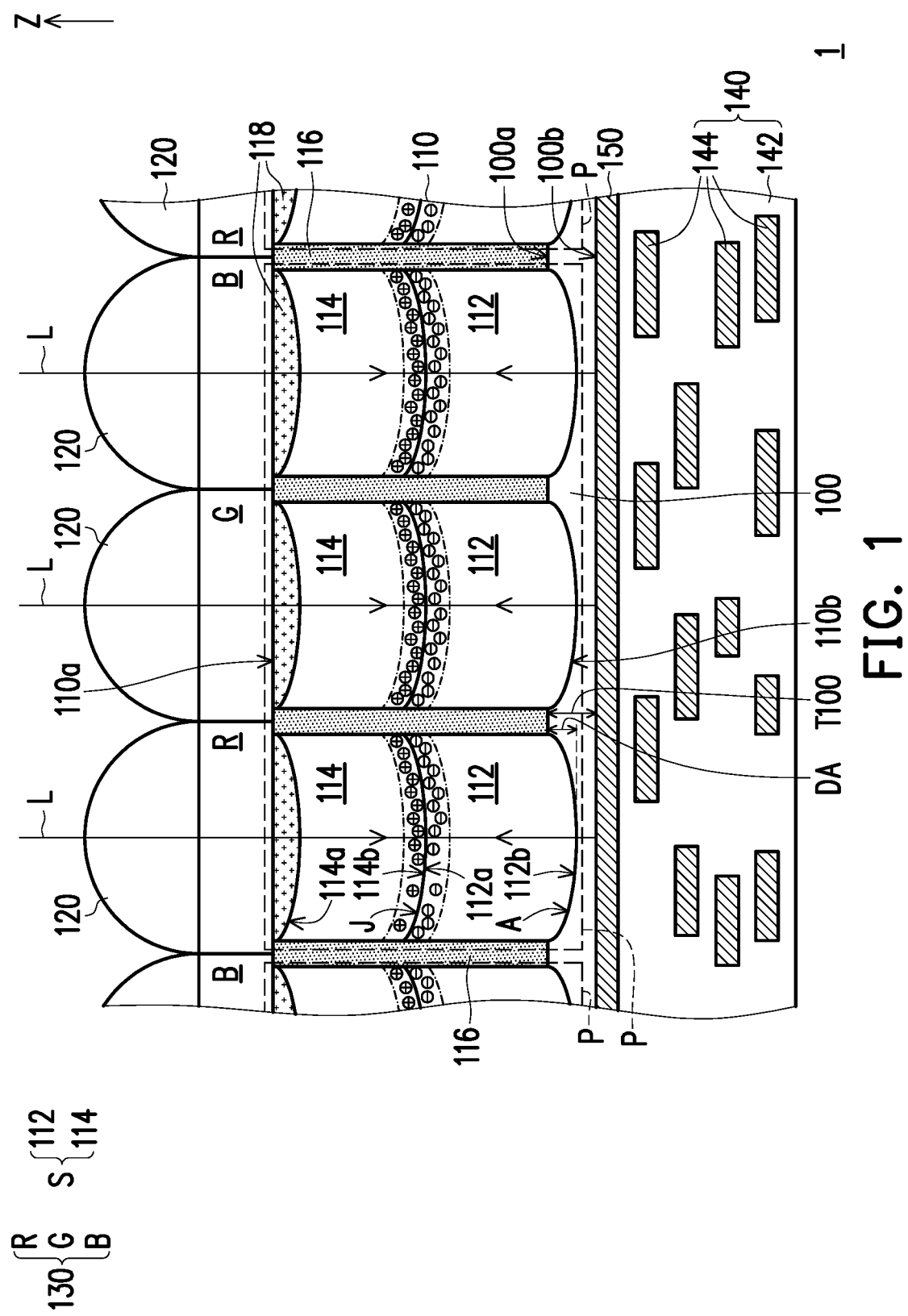
FIGS. 1 to 6 are respectively schematic diagrams of multiple semiconductor devices according to a first embodiment to a sixth embodiment of the disclosure.

The directional terms mentioned herein, such as "up", "down", "front", "rear", "left", "right", etc., are used only with reference to the orientation of the accompanying drawing(s). Therefore, the directional terms used are for illustrative purposes and are not intended to limit the disclosure.

In the accompanying drawings, each drawing illustrates general features of methods, structures, or materials used in a specific embodiment. However, the drawings should not be construed as defining or limiting the scope or nature covered by the embodiments. For example, the relative size, thickness, and position of each film layer, region, or structure may be reduced or enlarged for the sake of clarity.

In the following embodiments, the same or similar elements use the same or similar reference numerals, and redundant descriptions are omitted. In addition, the features in different embodiments can be combined without conflict, and simple equivalent changes and modifications made in accordance with the scope of this specification or patent application are still within the scope of this patent.

The terms "first" and "second" mentioned in this specification or in the scope of the patent application are only used to name different elements or distinguish different embodiments or ranges, and are not used to limit an upper or lower limit of the number of elements, nor to limit the manufacturing order or disposition order of the elements. In addition, the disposition of one element/film layer on (or above) another element/film layer can encompass the element/film layer being directly disposed on (or above) the other element/film layer, with the two elements/film layers being in direct contact with each other, and the element/film layer being indirectly disposed on (or above) the other element/film layer, with one or more elements/film layers located between the two elements/film layers.

Figure 2:
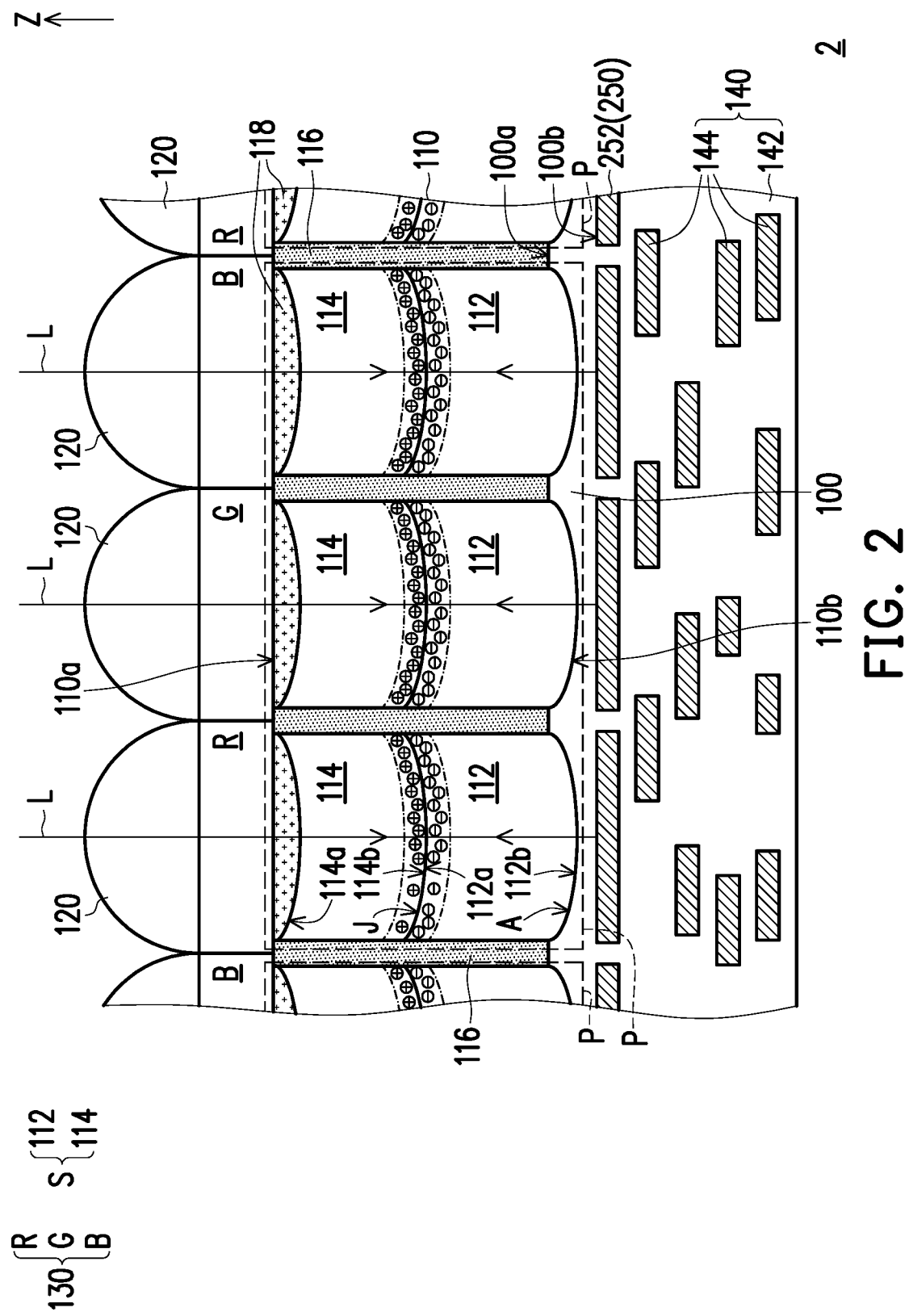
Figure 3:
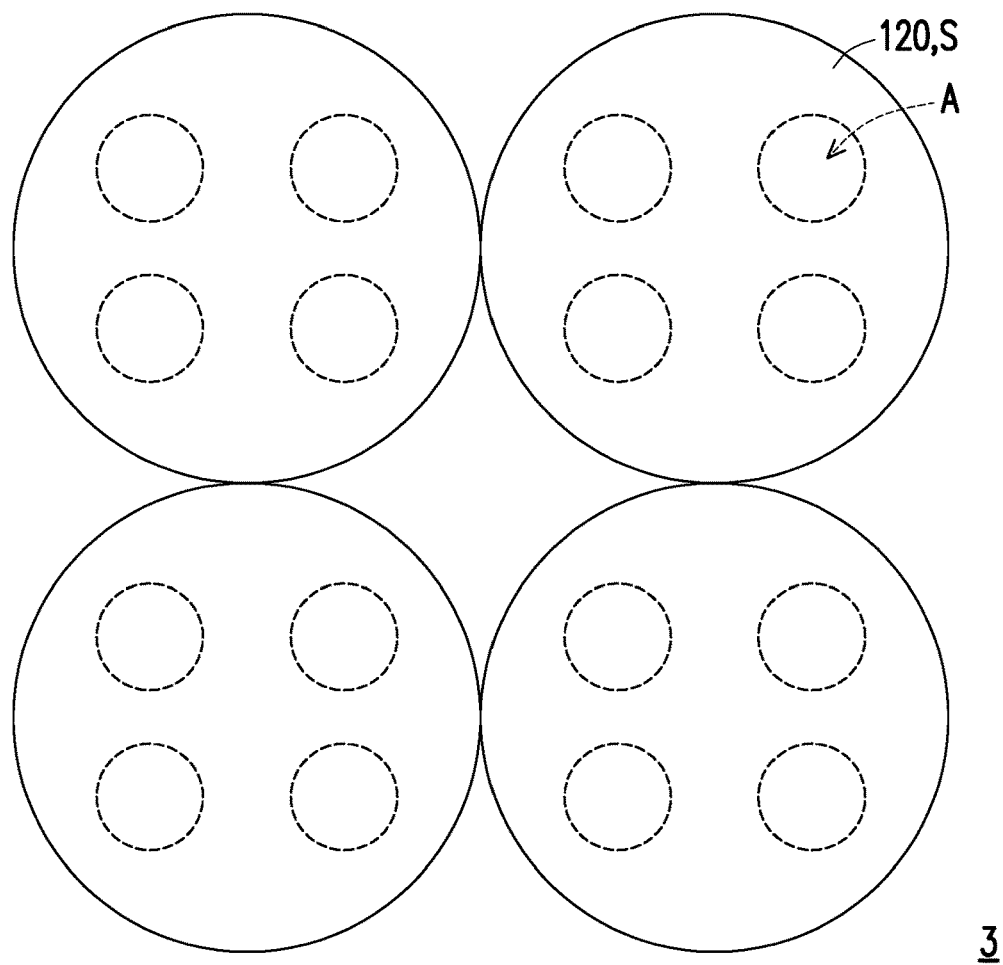

FIGS. 1 to 6 are respectively schematic diagrams of multiple semiconductor devices according to a first embodiment to a sixth embodiment of the disclosure. FIGS. 1, 2, 4, and 5 are respectively partial cross-sectional schematic diagrams of the multiple semiconductor devices, and FIG. 3 is a partial top view schematic diagram of the semiconductor device.

A semiconductor device according to an embodiment of the disclosure may be any type of device having a photosensitive element or a photoelectric conversion structure, such as an image sensor or a solar device, but is not limited thereto. The photosensitive element or the photoelectric conversion structure may include a stacked layer of a P-type semiconductor layer and an N-type semiconductor layer. In some embodiments, the photosensitive element or the photoelectric conversion structure may further include an intrinsic semiconductor layer, but is not limited thereto. Using the image sensor as an example, the image sensor may be used in various high-resolution or high-pixel electronic devices (such as cameras, mobile phones, and computers) for image shooting, and may, for example, achieve full-color image sensing, but is not limited thereto. In some embodiments, the image sensor may be used in a 12-megapixel or 64-megapixel electronic device. A size of each pixel may be, for example, $1.4*1.4\ \mu m^2$ or $0.7*0.7\ \mu m^2$ when the image sensor serves as a camera of a 64-megapixel mobile phone, but is not limited thereto.

With reference to FIG. 1, a semiconductor device 1 of the first embodiment is, for example, an image sensor. Using a back-side illuminated complementary metal-oxide-semiconductor image sensor (BSI-CIS) as an example, the semiconductor device 1 may include a dielectric layer 100, a semiconductor substrate 110, multiple micro-lens 120, multiple color filters 130, an internal connection structure 140, and a reflective layer 150, but is not limited thereto. The semiconductor device 1 may increase or decrease some of the elements or film layers according to different requirements.

A material of the dielectric layer 100 may include silicon oxide, silicon nitride, silicon oxynitride, phosphosilicate glass (PSG), borophosphosilicate glass (BPSG), spin-on glass (SOG), fluorinated silica glass (FSG), carbon-doped silica (such as SiCOH), polyimide, or a combination thereof, but is not limited thereto.

The dielectric layer 100 may have a concavity A (an opening or a recessed region of the dielectric layer 100). A formation manner of the concavity A may be any manner, and is not limited by the disclosure. For example, the concavity A may be formed by manners such as photolithography or laser drilling, but is not limited thereto. The etching may include dry etching, wet etching, or a combination thereof. As shown in FIG. 1, a cross-sectional shape of the concavity A may be semicircular, inverted trapezoid, quadrilateral (such as rectangular or square) or other polygons according to different designs or formation manners. The semicircle is not limited to half of a circle, but refers to an incomplete circle in general. A side wall surface of the concavity A may include an inclined surface, a longitudinal surface, a curved surface, or a combination thereof when the cross-sectional shape of the concavity A is a polygon. The inclined surface indicates that an angle formed between the side wall surface and a vertical direction Z is neither 0 degrees nor 90 degrees. The longitudinal surface indicates that the angle formed between the side wall surface and the vertical direction Z is 0 degrees. The curved surface indicates that the side wall surface has a radian or curvature, and the radian or curvature of the curved surface is not limited by the disclosure. In some embodiments, degree of inclination of the side wall surface may be controlled by isotropic etching (such as dry etching) or anisotropic etching (such as wet etching). In some embodiments, the two etching manners may be mixed to enable the side wall surface to have one or more slopes or curvatures.

In addition, the dielectric layer 100 may include multiple concavities A. FIG. 1 schematically shows three of the concavities A, but the number of the concavities A may be changed according to requirements (such as resolution or pixel size of the image sensor), and is not limited to what is shown in FIG. 1.

The concavity A extends from a top surface 100a of the dielectric layer 100 to a bottom surface 100b of the dielectric layer 100. In the embodiment, the top surface 100a of the dielectric layer 100 is a surface of the dielectric layer 100 facing the semiconductor substrate 110, and the bottom surface 100b of the dielectric layer 100 is a surface of the dielectric layer 100 facing the reflective layer 150. In some embodiments, a surface of the dielectric layer 100 in contact with the reflective layer 150 may serve as the bottom surface 100b of the dielectric layer 100.

A depth DA of the concavity A may be less than or equal to a thickness T100 of the dielectric layer 100. The depth DA of the concavity A refers to a distance from the top surface 100a of the dielectric layer 100 to a deepest part of concavity A. The deepest part may be, for example, center of the concavity A, but the deepest part of the concavity A may be changed according to the design or formation manner, and is not limited to what is shown in FIG. 1. The thickness T100 of the dielectric layer 100 refers to a maximum distance from the top surface 100a of the dielectric layer 100 to the bottom surface 100b of the dielectric layer 100. The concavity A may also be referred to as a blind hole when the depth DA of the concavity A is less than the thickness T100 of the dielectric layer 100. The concavity A may also be referred to as a via when the depth DA of the concavity A is equal to the thickness T100 of the dielectric layer 100.

The semiconductor substrate 110 is disposed on the dielectric layer 100. The semiconductor substrate 110 may include a suitable elemental semiconductor, such as crystalline silicon, diamond, or germanium, a suitable compound semiconductor, such as gallium arsenide, silicon carbide, indium arsenide, or indium phosphide, or a suitable alloy semiconductor, such as silicon germanium carbide, gallium arsenide, or gallium indium phosphide. The semiconductor substrate 110 may be a P-type substrate or an N-type substrate. For example, the semiconductor substrate 110 may be doped with a P-type dopant (such as boron) when the semiconductor substrate 110 is a P-type substrate, and the semiconductor substrate 110 may be doped with an N-type dopant (such as phosphorus, or arsenic) when the semiconductor substrate 110 is an N-type substrate.

The semiconductor substrate 110 may include multiple sensing pixels P arranged in an array. Each of the sensing pixels P may include multiple photosensitive elements S. Each of the photosensitive elements S may include a first type semiconductor layer 112 and a second type semiconductor layer 114, and each of the photosensitive elements S may overlap with one or more (≥1) concavities A. FIG. 1 schematically shows that each of the sensing pixels P includes three of the photosensitive elements S, and each of the photosensitive elements S overlaps with one of the concavities A. In this architecture, a size (such as length, width, or aperture size) of the concavity A is, for example, less than or equal to a size (such as length, width, or diameter) of the photosensitive element S. In other embodiments, each of the photosensitive elements S may also overlap with the multiple concavities A.

In each of the photosensitive elements S, the first type semiconductor layer 112 and the second type semiconductor layer 114 are sequentially stacked on the dielectric layer 100. One of the first type semiconductor layer 112 and the second type semiconductor layer 114 may be a P-type semiconductor layer, and the other of the first type semiconductor layer 112 and the second type semiconductor layer 114 may be an N-type semiconductor layer. In other embodiments, although not shown, each of the photosensitive elements S may further include an intrinsic layer disposed between the first type semiconductor layer 112 and the second type semiconductor layer 114. In other embodiments, although not shown, each of the photosensitive elements S may also include more than one of the first type semiconductor layer 112 and more than one of the second type semiconductor layer 114.

The first type semiconductor layer 112 is disposed on the concavity A, and a top surface 112a and a bottom surface 112b of the first type semiconductor layer 112 are, for example, recessed according to the concavity A. In the embodiment, the top surface 112a of the first type semiconductor layer 112 is a surface of the first type semiconductor layer 112 in contact with the second type semiconductor layer 114, and the bottom surface 112b of the first type semiconductor layer 112 is a surface of the first type semiconductor layer 112 in contact with the concavity A.

The second type semiconductor layer 114 is disposed on the first type semiconductor layer 112, and a bottom surface 114b of the second type semiconductor layer 114 is, for example, recessed according to the concavity A. On the other hand, a top surface 114a of the second type semiconductor layer 114 may also be recessed according to the concavity A. In some embodiments, the semiconductor substrate 110 may further include a flat layer 118, and the flat layer 118 is disposed on the top surface 114a of the second type semiconductor layer 114 to provide a flat surface for disposition of the multiple color filters 130, but is not limited thereto. A material of the flat layer 118 may include an organic insulating material, an inorganic insulating material, or a combination thereof. That is, the flat layer 118 may be a single layer or a composite layer. In another embodiment, although not shown, the top surface 114a of the second type semiconductor layer 114 may also form a flatter surface than the bottom surface 114b through a planarization process (such as a polishing process). In the embodiment, the top surface 114a of the second type semiconductor layer 114 is a surface of the second type semiconductor layer 114 in contact with the flat layer 118, and the bottom surface 114b of the second type semiconductor layer 114 is a surface of the second type semiconductor layer 114 in contact with the first type semiconductor layer 112. The bottom surface 114b of the second type semiconductor layer 114 and the top surface 112a of the first type semiconductor layer 112 constitute a P-N junction J. As shown in FIG. 1, electrons and holes form a depletion region (with reference to a region framed by dotted lines) near the P-N junction J.

A formation method of the first type semiconductor layer 112 and the second type semiconductor layer 114 may include an ion implantation method. Specifically, an active region may be doped with an N-type dopant (for example, phosphorus or arsenic) to form an N-type well when the semiconductor substrate 110 is a P-type substrate, and the P-N junction J formed in the semiconductor substrate 110 may execute an image sensing function. Similarly, the active region may be doped with a P-type dopant (for example, boron) to form a P-type well when the semiconductor substrate 110 is an N-type substrate.

Since the first type semiconductor layer 112 and the second type semiconductor layer 114 are disposed on the concavity A of the dielectric layer 100, the depth DA of the concavity A affects degree of recession (such as curvature and/or shape of the P-N junction J) of the P-N junction J in the semiconductor substrate 110. For example, the deeper the depth DA of the concavity A is, the more recessed the bottom surface 112b and the top surface 112a of the first type semiconductor layer 112, the bottom surface 114b and the top surface 114a of the second type semiconductor layer 114, and the P-N junction J are. In addition, an area (that is, a contact area between the first type semiconductor layer 112 and the second type semiconductor layer 114) of the P-N junction J is greater, as compared to a flat P-N junction.

According to Equation 1, a drift current "I" of the P-N junction is positively correlated to an area "A" of the P-N junction. In other words, the greater the area of the P-N junction J, the greater the current generated and the greater the quantum efficiency (QE), thereby effectively increasing sensitivity of the image sensor. In some embodiments, the area of the recessed P-N junction may be approximately $2\sqrt{2}$ times the area of the flat P-N junction when the size of the photosensitive element S is very small.

$$I = Aq\emptyset_0(1-e^{-\alpha W}) \qquad \text{Equation 1}$$

where q is a charge amount, $\emptyset_0$ is the number of photons per unit area per second, and $\alpha W \gg 1$ when the depletion region is sufficiently thick.

In the architecture of the back-side illuminated complementary metal-oxide-semiconductor image sensor (BSI-CIS), the first side 110a of the semiconductor substrate 110 may be referred to as a rear surface, and the second side 110b of the semiconductor substrate 110 may be referred to as a front surface (or an active surface). A light (or radiation) L is incident on the rear surface of the semiconductor substrate 110 (that is, the first side 110a), and enters the photosensitive element S through the rear surface (that is, the first side 110a) to perform the image sensing function. The P-N junction J is sensitive to the incident light L when a reversed bias is applied to the P-N junction J. At this time, the photosensitive element S is in a state of floating high impedance. After being irradiated by the light for a period of time, the photosensitive element S may generate a current, and a resultant voltage difference is an image signal. In other words, the light L received or detected by the photosensitive element S may be converted into a photocurrent, thereby generating an output image signal.

In some embodiments, the semiconductor substrate 110 may further include multiple isolation structures 116 to isolate the multiple photosensitive elements S from each other. In detail, the multiple isolation structures 116 define multiple active regions in the semiconductor substrate 110. The isolation structure 116 extends from the top surface 110a of the semiconductor substrate 110 toward the bottom surface 110b of the semiconductor substrate 110. The multiple photosensitive elements S are respectively formed in the multiple active regions defined in the semiconductor substrate 110. For example, the isolation structure 116 may include a deep trench isolation (DTI) structure to isolate the multiple photosensitive elements S from each other, enabling optical signal interference between the adjacent photosensitive elements S to be significantly reduced. However, in other embodiments, the isolation structure 116 may further include a shallow trench isolation (STI) structure, an implant isolation structure, or other isolation structures.

In some embodiments, although not shown, the semiconductor device 1 may also include one or more pixel transistors located on the active surface (that is, the second surface 110b) of the semiconductor substrate 110. For example, the pixel transistor may include a transfer transistor, which is configured to transfer charge generated in the photosensitive element S out of the photosensitive element S for reading. In addition, the pixel transistor may further include other transistors, such as a source-follower transistor, a row select transistors, or a reset transistor.

The multiple color filters 130 are disposed on the semiconductor substrate 110, and the multiple color filters 130 are, for example, disposed on the flat layer 118 and the multiple isolation structures 116, but are not limited thereto.

In addition, the multiple color filters 130 may be respectively disposed corresponding to the multiple photosensitive elements S.

The color filter 130 allows light with a specific wavelength range to be transmitted, while blocking light with a wavelength outside the specific range. For example, the multiple color filters 130 may include a red light filter R, a green light filter G, and a blue light filter B. The red light filter R allows red light to pass through, so that the red light is received by the photosensitive element S located below the red light filter R. The green filter G allows green light to pass through, so that the green light is received by the photosensitive element S located below the green filter G. The blue light filter B allows blue light to pass through, so that the blue light is received by the photosensitive element S located below the blue light filter B. In the embodiment, the semiconductor device 1 is suitable for sensing light whose light wavelength falls within the visible light range. However, in other embodiments, the semiconductor device 1 may also be configured to sense light whose light wavelength falls within the non-visible light range, such as infrared light, but is not limited thereto. Correspondingly, the multiple color filters 130 may also be replaced with filters that block the passage of light other than the infrared light.

The multiple micro-lenses 120 are disposed on the multiple color filters 130, and the multiple micro-lenses 120 are respectively disposed corresponding to the multiple color filters 130. The multiple micro-lenses 120 may constitute a micro-lens array. Center points of the multiple micro-lenses 120 are respectively substantially aligned with center points of the multiple color filters 130 in the vertical direction Z. The micro-lens 120 may be configured to focus the incident light L to the photosensitive element S. The light L may be incident substantially perpendicularly to the reflective layer 150 after the light L is refracted through the micro-lens 120, and the reflective layer 150 may then reflect the light L back to the photosensitive element S, so as to increase efficiency of light collection. Since the light L is incident almost perpendicularly, the light L is not reflected to the other photosensitive elements S nearby, which can reduce noise interference.

As shown in FIG. 1, the internal connection structure 140 is disposed on the active surface (that is, the second surface 110b) of the semiconductor substrate 110, and the dielectric layer 100 is disposed between the internal connection structure 140 and the semiconductor substrate 110. The internal connection structure 140 is electrically coupled to the multiple photosensitive elements S, so that signals generated from the multiple photosensitive elements S may be transmitted to other elements for processing.

In the embodiment, the internal connection structure 140 includes an interlayer dielectric (ILD) layer 142 and multiple circuit layers 144 alternately stacked in the interlayer dielectric layer 142. A material of the interlayer dielectric layer 142 may be similar to the material of the dielectric layer 100. For example, the material of the interlayer dielectric layer 142 may include silicon oxide, silicon nitride, silicon oxynitride, phosphosilicate glass, borophosphosilicate glass, spin-on glass, fluorinated silica glass, carbon-doped silica, polyimide or a combination thereof, but is not limited thereto. A material of the circuit layer 144 may include conductive materials, such as a metal, but is not limited thereto. The number of layers of the circuit layer 144 is, for example, four or five layers, but is not limited thereto. In other embodiments, the internal connection structure 140 may include more layers or fewer layers of the circuit layers 144. Specifically, one of the multiple circuit layers 144 closest to the semiconductor substrate 110 may be a metal one layer, while the circuit layers 144 sequentially stacked on top of the metal one layer in opposite direction of the vertical direction Z may be a metal two layer, a metal three layer, and so on. Using a five-layer circuit layer 144 as an example, the one of the multiple circuit layers 144 closest to the semiconductor substrate 110 may be the metal one layer, and one of the multiple circuit layers 144 furthest from the semiconductor substrate 110 may be a metal five layer. A person applying the embodiment may also dispose the one of the multiple circuit layers 144 closest to the semiconductor substrate 110 on the metal five layer, and dispose the one of the multiple circuit layers 144 furthest from the semiconductor substrate 110 on the metal one layer, and so on. In the embodiment, since the internal connection structure 140 is disposed on an opposite side (that is, the second surface 110b) of the light incident surface (that is, the first surface 110a), that is, below the photosensitive element S, the internal connection structure 140 does not block the light L from irradiating the photosensitive element S.

Figure 5:
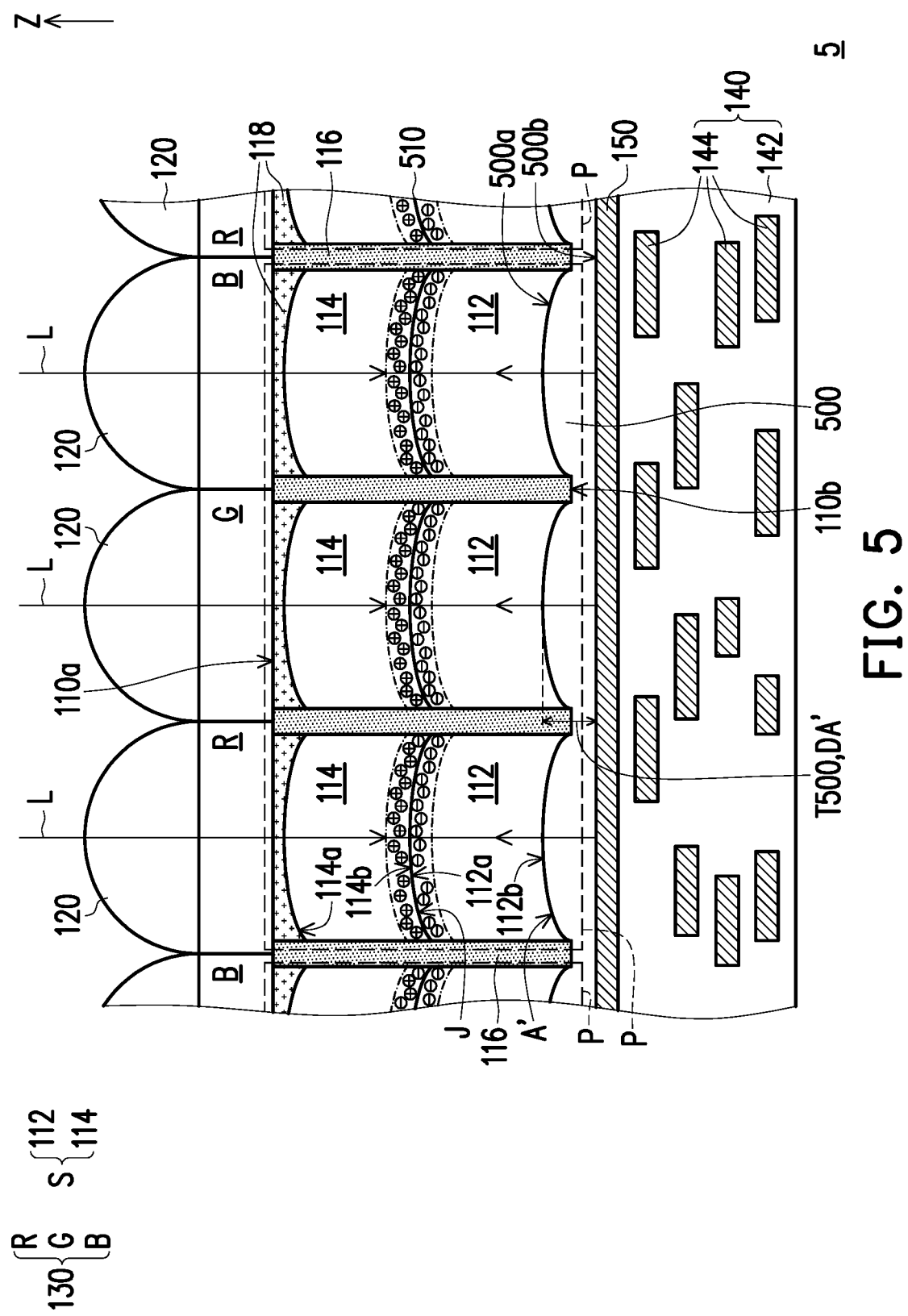

In the embodiment, the reflective layer 150 is disposed on the internal connection structure 140, and the dielectric layer 100 is disposed between the reflective layer 150 and the semiconductor substrate 110. However, in another embodiment, the reflective layer 150 may also be disposed between the dielectric layer 100 and the semiconductor substrate 110. In other words, the dielectric layer 100 may be formed first, and then the reflective layer 150 may be formed on the dielectric layer 100, but is not limited thereto. With the reflective layer 150 disposed between the dielectric layer 100 and the semiconductor substrate 110, the reflective layer 150 disposed on the dielectric layer 100 may conform to the surface of the dielectric layer 100 facing the semiconductor substrate 110. That is, the reflective layer 150 may be recessed according to multiple of the concavity A, or, the reflective layer 150 may be protruded according to multiple convexities when the dielectric layer includes the multiple convexities (as shown in FIG. 5).

The reflective layer 150 may be a sheet-shaped metal layer. The reflective layer 150 extends continuously in a direction parallel to the semiconductor substrate 110, and orthographic projection of the multiple photosensitive elements S on the reflective layer 150 is located within a range of the reflective layer 150. In other words, when viewed from a top-down direction (from top to bottom), the multiple photosensitive elements S may overlap with the reflective layer 150, and enable the light L penetrating the photosensitive element S to be reflected by the reflective layer 150 so that the light L irradiates the photosensitive element S again. In the embodiment, the reflective layer 150 may, for example, be formed in a same process as the one (that is, the metal one layer) of the multiple circuit layers 144 closest to the semiconductor substrate 110. In other words, the reflective layer 150 may, for example, be located at a same level as the one (that is, the metal one layer) of the multiple circuit layers 144 closest to the semiconductor substrate 110, and the reflective layer 150 and the circuit layer 144 may include a same material (for example, a metal). It should be noted that, in order to clearly show the reflective layer 150, the circuit layer (that is, the metal one layer) at the same level as the reflective layer 150 is not shown.

Since the reflective layer 150 and the circuit layer 144 may be formed concurrently, that is, the reflective layer 150 may be made using the existing process, there is no need to introduce an additional process step, which has advantages such as high process compatibility and no additional cost. In addition, since the reflective layer 150 may be a metal layer, the reflection of the light L on the reflective layer 150 may be specular reflection, and is not prone to scattering. Therefore, the light L incident perpendicularly to the semiconductor substrate 110 may be reflected perpendicularly back to the photosensitive element S to prevent the light L from scattering to the other photosensitive elements S nearby, which can reduce noise interference. Even if the light L incident perpendicularly to the semiconductor substrate 110 generates interface reflection at the recessed parts (such as the top surface 114a, the P-N junction J, the bottom surface 112b), the reflected light will be directed to a higher surrounding of the recessed part, and therefore may be received by the photosensitive element S and converted into the photocurrent.

In the embodiment, the reflective layer 150 is electrically disconnected from the photosensitive element S. In an embodiment, the reflective layer 150 may be coupled to a power supply voltage (VDD) or a ground voltage (GND), enabling the reflective layer 150 to serve as a signal shield to reduce signal interference and disturbance between the photosensitive element S and the circuit layer 144. However, in other embodiments, the reflective layer 150 may also be electrically floating. In an architecture where the first type semiconductor layer 112 is the P-type semiconductor layer, the first type semiconductor layer 112 is typically coupled to a ground voltage, such as a common ground voltage (VSS). In some embodiments, the bottom surface 112b of the first type semiconductor layer 112 may be enabled to be in contact with the reflective layer 150 by a design in which the concavity A is a through hole (that is, the depth DA of the concavity A is equal to the thickness T100 of the dielectric layer 100, which enables the reflective layer 150 located below the dielectric layer 100 to be exposed by the concavity A), thereby allowing the first type semiconductor layer 112 to be coupled to a ground voltage, such as a metal ground.

With reference to FIG. 2, a semiconductor device 2 of a second embodiment is similar to the semiconductor device 1 in FIG. 1, therefore details are not repeated. Compared with FIG. 1, a reflective layer 250 of the semiconductor device 2 in FIG. 2 may include multiple separated reflective regions 252, and orthographic projections of the multiple photosensitive elements S on the reflective layer 250 are respectively located in a range of the multiple reflective regions 252. In other words, when viewed from the top-down direction (from top to bottom), each of the photosensitive elements S may overlap with one of the reflective regions 252, and enable the light L penetrating the photosensitive element S to be reflected by the reflective layer 250 so that the light L irradiates the photosensitive element S again. In some embodiments, the reflective layer 250 may further include multiple connecting lines (not shown) connecting the multiple reflective regions 252.

With reference to FIG. 3, a semiconductor device 3 of a third embodiment is similar to the semiconductor device 1 in FIG. 1, therefore the details are not repeated. Compared with FIG. 1, each of the photosensitive elements S of the semiconductor device 3 in FIG. 3 overlaps with multiple (such as four, but is not limited thereto) concavities A. It should be understood that FIG. 3 only schematically shows some of the micro-lens 120, the photosensitive elements S, and the concavities A in the semiconductor device 3, with omission of the other elements. In addition, as the size of the photosensitive element S increases, a greater number of the concavities A may overlap with the photosensitive element S, therefore increasing sensing sensitivity of the image sensor, but is not limited thereto. In addition, the shape of the concavity A when viewed from the top-down direction (from top to bottom), besides being a circle, may also include a rectangle, a square, a hexagon, or other polygons, and the shapes of the multiple concavities A may be the same or different. In some embodiments, a distance between the concavities in the photosensitive element S may be changed through changing a distance between the multiple concavities A, so as to be selective to a spectrum. For example, the multiple concavities A overlapping with a red filter, the multiple concavities A overlapping with a green filter, and the multiple concavities A overlapping with a blue filter may have different sizes or pitches, so as to enable the photosensitive element S corresponding to the different color filters are selective to the spectrum.

Figure 4:
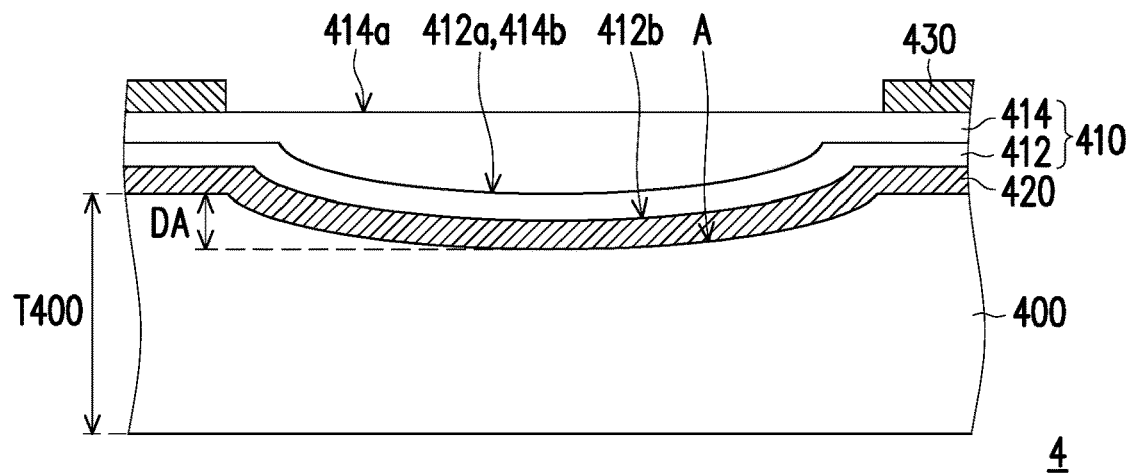

With reference to FIG. 4, a main difference between a semiconductor device 4 of a fourth embodiment and the semiconductor device 1 in FIG. 1 is that the semiconductor device 4 is a solar device. In detail, the semiconductor device 4 includes a dielectric layer 400, a semiconductor substrate 410, a bottom electrode 420, and a top electrode 430.

A material of the dielectric layer 400 may include the material of the dielectric layer 100 in FIG. 1, but is not limited thereto. The dielectric layer 400 has the concavity A. The depth DA of the concavity A may be less than or equal to a thickness T400 of the dielectric layer 400.

The semiconductor substrate 410 may include a first type semiconductor layer 412 and a second type semiconductor layer 414 sequentially stacked on the dielectric layer 400. One of the first type semiconductor layer 412 and the second type semiconductor layer 414 may be a P-type semiconductor layer, and the other of the first type semiconductor layer 412 and the second type semiconductor layer 414 may be an N-type semiconductor layer. In other embodiments, although not shown, the semiconductor substrate 410 may further include an intrinsic layer disposed between the first type semiconductor layer 412 and the second type semiconductor layer 414.

The first type semiconductor layer 412 is located in the concavity A. A top surface 412a and a bottom surface 412b of the first type semiconductor layer 412 are recessed according to the concavity A. A bottom surface 414b of the second type semiconductor layer 414 is recessed according to the concavity A. A top surface 414a of the second type semiconductor layer 414 may form a flat surface through a planarization process, so as to facilitate disposition of the top electrode 430, but is not limited thereto. In other embodiments, the top surface 414a of the second type semiconductor layer 414 may also be recessed according to the concavity A.

The top electrode 430 may be, for example, a patterned electrode, to facilitate passage of the light and irradiation of the semiconductor substrate 410. The bottom electrode 420 is disposed between the dielectric layer 400 and the semiconductor substrate 410, and at least a portion of the bottom electrode 420 may be recessed according to the concavity A.

With reference to FIG. 5, a main difference between a semiconductor device 5 of a fifth embodiment and the semiconductor device 1 in FIG. 1 is described as follows. In the semiconductor device 5, a dielectric layer 500 has a convexity A'. A formation manner of the convexity A' may be any manner, and is not limited by the disclosure. For example, the convexity A' may be formed through photolithography (for example, using a negative photoresist, but is not limited thereto), but is not limited thereto. Reference may be made to the cross-sectional shape of the concavity A for a cross-sectional shape of the convexity A', and is not limited by the disclosure. In addition, a side wall surface of the convexity A' may include an inclined surface, a longitudinal surface, a curved surface, or a combination thereof. In some embodiments, degree of inclination of the side wall surface may be controlled by isotropic etching (such as dry etching) or anisotropic etching (such as wet etching). In some embodiments, the two etching manners may be mixed to enable the side wall surface to have one or more slopes or curvatures.

In addition, the dielectric layer 500 may include multiple convexities A'. FIG. 5 schematically shows three of the convexities A', but the number of the convexities A' may be changed according to requirements (such as the resolution or pixel size of the image sensor), and is not limited to what is shown in FIG. 5.

The convexity A' extends from a bottom surface 500b of the dielectric layer 500 toward a semiconductor substrate 510. In the embodiment, a top surface 500a of the dielectric layer 500 is a surface of the dielectric layer 500 facing the semiconductor substrate 510, and the bottom surface 500b of the dielectric layer 500 is a surface of the dielectric layer 500 facing the reflective layer 150. In some embodiments, a surface of the dielectric layer 500 in contact with the reflective layer 150 may serve as the bottom surface 500b of the dielectric layer 500.

A thickness DA' of the convexity A' may be less than or equal to a thickness T500 of the dielectric layer 500. The thickness DA' of the convexity A' refers to a distance from a highest point of the convexity A' to the bottom surface 500b of the dielectric layer 500. The thickness T500 of the dielectric layer 500 refers to a maximum distance from the top surface 500a of the dielectric layer 500 to the bottom surface 500b of the dielectric layer 500. The highest point of the convexity A' may be center of the convexity A', but the highest point of the convexity A' may be changed according to the design or formation manner, and is not limited to what is shown in FIG. 5. FIG. 5 shows an example in which the thickness DA' of the convexity A' is equal to the thickness T500 of the dielectric layer 500. However, in other embodiments, the thickness DA' of the convexity A' may be less than the thickness T500 of the dielectric layer 500.

A size (such as length, width or aperture size) of the convexity A' is, for example, less than or equal to the size (such as length, width or diameter) of the photosensitive element S. In each of the photosensitive elements S, the first type semiconductor layer 112 is disposed on the strength A'. The top surface 112a and the bottom surface 112b of the first type semiconductor layer 112 are protruded according to the convexity A', and the bottom surface 114b of the second type semiconductor layer 114 is also protruded according to the convexity A'. On the other hand, the top surface 114a of the second type semiconductor layer 114 may also be protruded according to the convexity A'. In some embodiments, the semiconductor substrate 510 may further include the flat layer 118, and the flat layer 118 is disposed on the top surface 114a of the second type semiconductor layer 114 to provide multiple flat surfaces for the disposition of the color filters 130, but is not limited thereto. In another embodiment, although not shown, the top surface 114a of the second type semiconductor layer 114 may also form a flatter surface than the bottom surface 114b through a planarization process (such as a polishing process).

Since the first type semiconductor layer 112 and the second type semiconductor layer 114 are disposed on the convexity A' of the dielectric layer 500, degree of convexity of the convexity A' affects degree of convexity (such as the curvature and/or shape of the P-N junction J) of the P-N junction J in the semiconductor substrate 510. For example, the more protruding the convexity A' is, the more protruding the bottom surface 112b and the top surface 112a of the first type semiconductor layer 112, the bottom surface 114b and the top surface 114a of the second type semiconductor layer 114, and the P-N junction J are. In addition, the area (that is, the contact area between the first type semiconductor layer 112 and the second type semiconductor layer 114) of the P-N junction J is greater, as compared to the flat P-N junction. The greater the area of the P-N junction J, the greater the current generated and the greater the quantum efficiency, thereby effectively increasing the sensitivity of the image sensor. In some embodiments, the area of the protruding P-N junction may be approximately $2\sqrt{2}$ times the area of the flat P-N junction when the size of the photosensitive element S is very small.

The concavity A in the semiconductor device 2 in FIG. 2 to the semiconductor device 4 in FIG. 4 may also change to the convexity A' shown in FIG. 5, and details are not repeated here.

Figure 6:
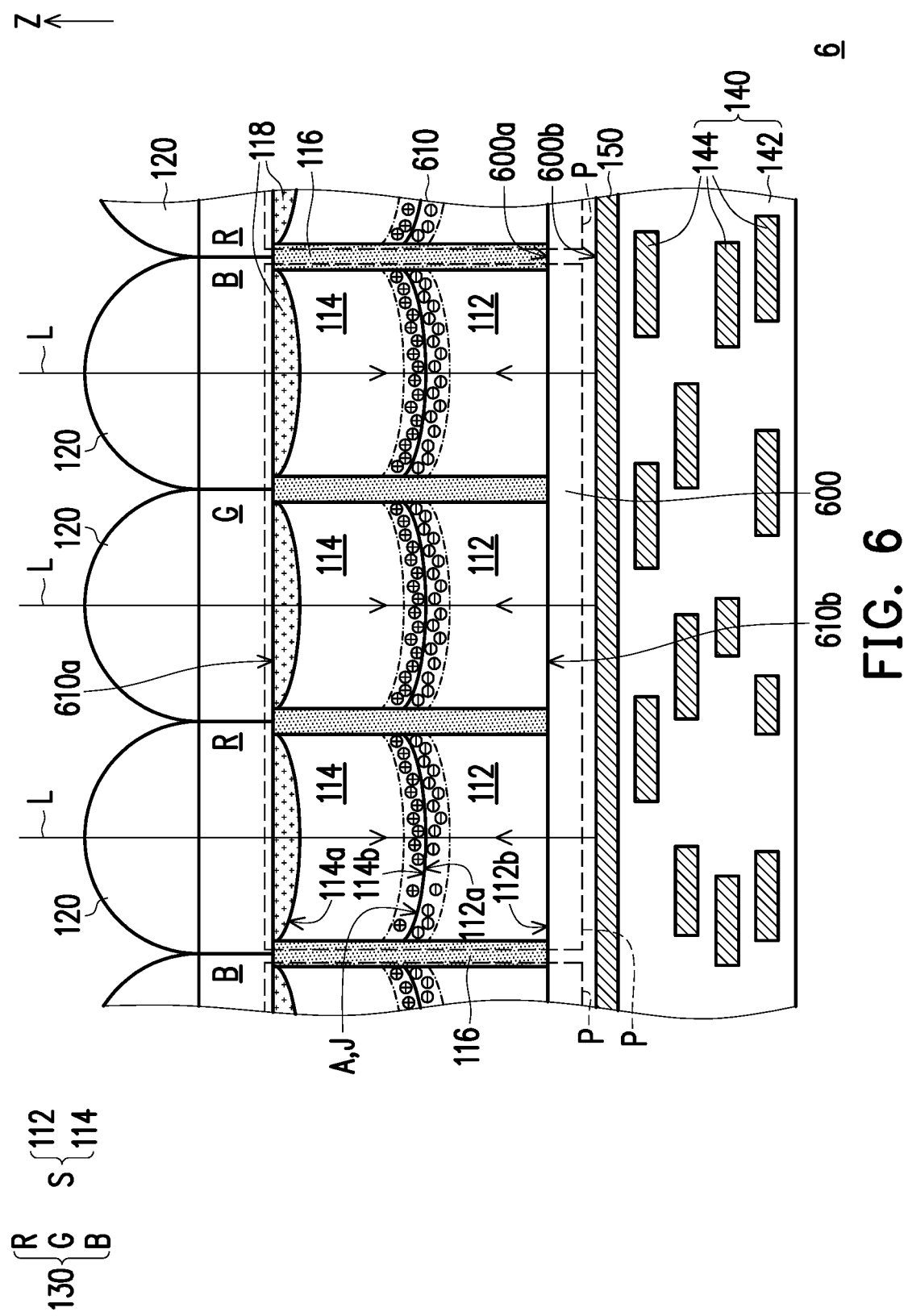

With reference to FIG. 6, a main difference between a semiconductor device 6 of the sixth embodiment and the semiconductor device 1 in FIG. 1 is described as follows. In the semiconductor device 6, a top surface 600a of a dielectric layer 600 is substantially conformed to a bottom surface 600b of the dielectric layer 600 without forming the concavity A in FIG. 1 or the convexity A' in FIG. 5. That is, the top surface 600a of the dielectric layer 600 is, for example, a flat surface. Correspondingly, a second side 610b of a semiconductor substrate 610 and a first side 610a of the semiconductor substrate 610 disposed on the dielectric layer 600 are also, for example, flat surfaces. In addition, in the semiconductor substrate 610, the bottom surface 112b of the first type semiconductor layer 112 disposed on the dielectric layer 600 is also, for example, a flat surface. On the other hand, the multiple concavities A or the multiple convexities A may be formed on the top surface 112a of the first type semiconductor layer 112 by, for example, an etching process (refer to FIG. 5). In this way, the bottom surface 114b of the second type semiconductor layer 114, which is disposed on the top surface 112a of the first type semiconductor layer 112, is also recessed according to the concavities A or protruded according to the convexities A'. On the other hand, the top surface 114a of the second type semiconductor layer 114 may also be recessed according to the concavity A or protruded according to the convexity A'.

In summary, the semiconductor device according to the embodiment of the disclosure can increase the surface area of the junction between the multiple semiconductor layers disposed on the convexity or the concavity of the dielectric layer by forming the convexity or the concavity in the dielectric layer, so that the current generated by the irradiation of the photosensitive element or the photoelectric conversion structure in the semiconductor substrate can be increased. The distance between the concavities or convexities in the photosensitive element may be changed through changing the spacing between the concavities or the convexities, so as to be selective to the spectrum, which is helpful in enhancing the sensitivity of the CMOS image sensor.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A semiconductor device, comprising:
a dielectric layer, with a convexity or a concavity; and
a semiconductor substrate, comprising a first type semiconductor layer and a second type semiconductor layer sequentially stacked on the dielectric layer, wherein the first type semiconductor layer is disposed on the convexity or the concavity, a top surface and a bottom surface of the first type semiconductor layer are protruded according to the convexity or recessed according to the concavity, and a top surface and a bottom surface of the second type semiconductor layer are protruded according to the convexity or recessed according to the concavity, and wherein:
the semiconductor device is an image sensor that comprises a photodiode comprising the first type semiconductor layer and the second type semiconductor layer, and
a thickness of the dielectric layer gradually decreases outward from a center of the convexity or gradually increases outward from a center of the concavity.

2. The semiconductor device according to claim 1, wherein a thickness of the convexity is less than or equal to the thickness of the dielectric layer, and a depth of the concavity is less than or equal to the thickness of the dielectric layer.

3. The semiconductor device according to claim 1, wherein the dielectric layer comprises a plurality of the convexities or a plurality of the concavities, the semiconductor substrate further comprises a plurality of sensing pixels arranged in an array, each of the sensing pixels comprises a plurality of photosensitive elements, each of the photosensitive elements comprises one of the first type semiconductor layer and one of the second type semiconductor layer, and each of the photosensitive elements overlaps with more than one of the convexities or overlaps with more than one of the concavities.

4. The semiconductor device according to claim 3, further comprising:
a plurality of color filters, disposed on the semiconductor substrate;
a plurality of micro-lens, disposed on the plurality of color filters; and
an internal connection structure, electrically coupled to the plurality of photosensitive elements, wherein the dielectric layer is disposed between the internal connection structure and the semiconductor substrate.

5. The semiconductor device according to claim 3, further comprising:
a reflective layer, wherein the dielectric layer is disposed between the reflective layer and the semiconductor substrate, or the reflective layer is disposed between the dielectric layer and the semiconductor substrate.

6. The semiconductor device according to claim 5, wherein the reflective layer is coupled to a power supply voltage or a ground voltage.

7. The semiconductor device according to claim 5, wherein the reflective layer extends continuously in a direction parallel to the semiconductor substrate, and an orthographic projection of the plurality of photosensitive elements on the reflective layer is located within a range of the reflective layer.

8. The semiconductor device according to claim 5, wherein the reflective layer comprises a plurality of separated reflective regions, and orthographic projections of the plurality of photosensitive elements on the reflective layer are respectively located within a range of the plurality of reflective regions.

9. The semiconductor device according to claim 3, wherein the semiconductor substrate further comprises:
a plurality of isolation structures, isolating the plurality of photosensitive elements from each other.

10. A semiconductor device, comprising:
a semiconductor substrate, comprising a first type semiconductor layer and a second type semiconductor layer, wherein the first type semiconductor layer has a top surface and a bottom surface, the bottom surface of the first type semiconductor layer has a convexity or a concavity, the top surface of the first type semiconductor layer is protruded according to the convexity or recessed according to the concavity, the second type semiconductor layer is disposed on the top surface of the first type semiconductor layer, and a top surface and a bottom surface of the second type semiconductor layer are protruded according to the convexity or recessed according to the concavity, and wherein:
the semiconductor device is an image sensor that comprises a photodiode comprising the first type semiconductor layer and the second type semiconductor layer.

11. A semiconductor device, comprising:
a dielectric layer without convexities or concavities; and
a semiconductor substrate, comprising a first type semiconductor layer and a second type semiconductor layer, wherein the first type semiconductor layer is disposed between the dielectric layer and the second type semiconductor layer and has a top surface having a convexity or a concavity, the second type semiconductor layer is disposed on the top surface of the first type semiconductor layer, and a bottom surface of the second type semiconductor layer is protruded according to the convexity or recessed according to the concavity, and
wherein a thickness of the first type semiconductor layer gradually decreases outward from a center of the convexity or gradually increases outward from a center of the concavity.

* * * * *